(12) United States Patent
Seo et al.

(10) Patent No.: US 11,445,610 B2
(45) Date of Patent: Sep. 13, 2022

(54) PRINTED CIRCUIT BOARD ASSEMBLY

(71) Applicant: SOLUM CO., LTD., Yongin-si (KR)

(72) Inventors: Chang Min Seo, Osan-si (KR); Yong Jae Kim, Osan-si (KR); Dae Hyun Jang, Suwon-si (KR)

(73) Assignee: SOLUM CO., LTD., Yongin-si (KR)

( * ) Notice: Subject to any disclaimer, the term of this patent is extended or adjusted under 35 U.S.C. 154(b) by 0 days.

(21) Appl. No.: 17/210,406

(22) Filed: Mar. 23, 2021

(65) Prior Publication Data
US 2022/0022319 A1     Jan. 20, 2022

(30) Foreign Application Priority Data

Jul. 16, 2020 (KR) .................. 10-2020-0088155
Jan. 6, 2021 (KR) .................. 10-2021-0001416

(51) Int. Cl.
*H05K 1/14* (2006.01)

(52) U.S. Cl.
CPC ... *H05K 1/142* (2013.01); *H05K 2201/09063* (2013.01)

(58) Field of Classification Search
CPC ............... H05K 1/142; H05K 2201/09063
See application file for complete search history.

(56) References Cited

U.S. PATENT DOCUMENTS

| | | | |
|---|---|---|---|
| 3,895,266 A | 7/1975 | Geiger | |
| 4,742,183 A * | 5/1988 | Soloway | H05K 1/148 |
| | | | 174/254 |
| 6,122,161 A * | 9/2000 | Gierut | H05K 1/142 |
| | | | 439/74 |
| 6,406,332 B1 * | 6/2002 | Buican | H01R 12/721 |
| | | | 439/631 |
| 6,976,848 B2 * | 12/2005 | Choi | H05K 1/142 |
| | | | 257/723 |

(Continued)

FOREIGN PATENT DOCUMENTS

| | | |
|---|---|---|
| DE | 102011103854 A1 | 11/2012 |
| JP | 2013084609 A | 5/2013 |

(Continued)

OTHER PUBLICATIONS

Extended European Search Report issued by the European Patent Office for EP Application No. 21181191.4 filed Jun. 23, 2021, on behalf of Solum Co Ltd, dated Jan. 21, 2022. 9 Pages.

(Continued)

*Primary Examiner* — Hoa C Nguyen
(74) *Attorney, Agent, or Firm* — Steinfl + Bruno LLP

(57) ABSTRACT

A PCB assembly includes a second PCB disposed adjacent to a first PCB and have a second hole facing a first hole, an upper plate disposed at an upper of the first and second hole and have a third hole disposed at the upper of the first hole and a fourth hole disposed at the upper of the second hole, a holder disposed at a lower of the first and second hole and have a lower plate having a fifth hole disposed at the lower of the first hole and a sixth hole disposed at the lower of the second hole, a first fixing screw penetrating through the third first, and fifth hole, and a second fixing screw penetrating through the fourth, second and sixth hole, and the lower plate includes a protrusion penetrating through the second PCB coupling the first PCB and the second PCB.

19 Claims, 9 Drawing Sheets

(56) References Cited

U.S. PATENT DOCUMENTS

| | | | | |
|---|---|---|---|---|
| 7,547,214 | B2* | 6/2009 | Duesterhoeft | H01R 12/68 |
| | | | | 439/61 |
| 7,553,163 | B2* | 6/2009 | McAlonis | H05K 1/142 |
| | | | | 439/60 |
| 7,845,985 | B2 | 12/2010 | Brunker et al. | |
| 10,709,024 | B1* | 7/2020 | Radzinski | H01R 12/52 |
| 2009/0031062 | A1* | 1/2009 | Shen | G06F 13/409 |
| | | | | 710/100 |
| 2009/0269976 | A1* | 10/2009 | Costello | H01R 12/52 |
| | | | | 361/760 |
| 2010/0085130 | A1* | 4/2010 | Margomenos | H01P 5/04 |
| | | | | 333/33 |
| 2014/0299893 | A1* | 10/2014 | Weng | H01R 12/732 |
| | | | | 439/81 |
| 2016/0049741 | A1* | 2/2016 | Cassin | H01R 12/00 |
| | | | | 29/830 |
| 2017/0164499 | A1 | 6/2017 | Shearman et al. | |
| 2019/0252810 | A1* | 8/2019 | Holec | H01R 12/721 |

FOREIGN PATENT DOCUMENTS

| | | |
|---|---|---|
| WO | 2009/111441 A1 | 9/2009 |
| WO | 2010/094007 A1 | 8/2010 |

OTHER PUBLICATIONS

Notice of Preliminary Rejection issued by the Korean Patent Office for Korean Patent Application No. 10-2021-0001416 filed Jan. 6, 2021, on behalf of Solum Co Ltd. dated Jun. 20, 2022. Korean Original and English Translation. 13 Pages.

* cited by examiner

PRINTED CIRCUIT BOARD ASSEMBLY

CROSS-REFERENCE TO RELATED APPLICATION

This application is based on and claims priority under 35 U.S.C. § 119 to Korean patent application number 10-2020-0088155 and Korean patent application number 10-2021-0001416, filed on Jul. 16, 2020 and Jan. 6, 2021, respectively, in the Korean Intellectual Property Office, the disclosure of which is incorporated by reference herein in its entirety.

BACKGROUND

1. Field

The disclosure relates to a printed circuit board (PCB) assembly, and more particularly to a PCB assembly comprising a holder and a plurality of fixing screws.

2. Description of Related Art

A printed circuit board (PCB) may, as an insulating card to which an electronic component may be coupled, be installed with electric circuits and used in a variety of electronic products.

In electronic products, circuits which perform various roles may be installed on the PCB, and in terms of electronic products such as, for example, and without limitation, TVs, mobile phones, computers, and periphery devices, a power unit which is a circuit that provides power and a signal unit which is a circuit that transfers electric signals may be installed to the PCB.

However, if a power unit and a signal unit are installed together on a PCB comprised of one substrate, that is if circuits of different types are installed on one PCB, there was the disadvantage of having to reproduce or replace the whole PCB to improve or replace one of the power unit circuit or the signal unit circuit, and the reason for costs increasing in terms of manufacturing.

SUMMARY

Aspects of the disclosure are to address at least the above-mentioned problems and/or disadvantages and to provide at least the advantages described below. Accordingly, an aspect of the disclosure is to provide a PCB assembly in which a first PCB and a second PCB are supported and coupled by a holder and fixing screws.

According to an embodiment, a PCB assembly includes a first PCB configured to have a first hole, a second PCB configured to be disposed adjacently to the first PCB and have a second hole disposed to face the first hole, a holder including an upper plate configured to be disposed at an upper part of the first hole and the second hole and have a third hole disposed at the upper part of the first hole and a fourth hole disposed at the upper part of the second hole, and a lower plate configured to be disposed at a lower part of the first hole and the second hole and have a fifth hole disposed at the lower part of the first hole and a sixth hole disposed at the lower part of the second hole, a first fixing screw configured to penetrate through the third hole, the first hole and the fifth hole, and a second fixing screw configured to penetrate through the fourth hole, the second hole and the sixth hole, and the lower plate includes a protrusion part configured to penetrate through the second PCB and couple.

According to an embodiment of the disclosure, a PCB assembly includes a first substrate configured to have a first hole, a second substrate configured to be disposed at one side of the first substrate, and have a second hole, a holder including an upper plate configured to be disposed on a one surface of the first substrate and a one surface of the second substrate, and have a third hole and a fourth hole, a lower plate configured to be disposed on a other surface facing the one surface of the first substrate and a other surface facing the one surface of the second substrate, and have a fifth hole and a sixth hole, and a protrusion part configured to be interposed between the first substrate and the second substrate in-between the upper plate and the lower plate, a first coupling member provided inside the first hole, the third hole, and the fifth hole, and a second coupling member provided inside the second hole, the fourth hole, and the sixth hole.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Example embodiments may be described with reference to the accompanying drawings in order to sufficiently understand the configuration and effect of the disclosure. However, the disclosure is not limited to the embodiments disclosed herein, and may be implemented in various forms and various modification may be made thereto. Descriptions of the embodiments are provided to augment the disclosure, and to enable those of ordinary skill in the technical field to which the disclosure pertains to fully understand the scope. Elements in the enclosed drawings have been illustrated and enlarged in size compared to actual size for convenience of description, and the ratio of each element may be exaggerated or minimized.

The terms used in describing the various example embodiments of the disclosure are general terms that have been selected considering their function herein. However, the terms may change depending on intention, legal or technical interpretation, emergence of new technologies, and the like of those skilled in the related art. Further, in certain cases, there may be terms arbitrarily selected. In this case, the meaning of the term may be interpreted as defined in the description, or may be interpreted based on the overall context of the disclosure and the technical common sense according to the related art.

In the disclosure, expressions such as "comprise," "may comprise," "include," or "may include," are used to designate a presence of a corresponding characteristic (e.g., elements such as numerical value, function, operation, or component, etc.), and not to preclude a presence or a possibility of additional characteristics.

In addition, terms such as 'front surface,' 'rear surface,' 'top surface,' 'bottom surface,' 'side surface,' 'left side,' 'right side,' 'upper part,' 'lower part,' 'area,' and the like used in the disclosure may be defined based on the drawings, and forms and locations of each element are not limited by these terms.

Further, because elements necessary in describing each embodiment of the disclosure are described in the disclosure, the embodiments are not limited thereto. Accordingly, some elements may be modified or omitted, and other elements may be added. In addition, the elements may be distributed to devices independent from one another and arranged.

Furthermore, although one or more embodiments of the disclosure have been described in detail below with reference to the accompanied drawings and the descriptions of the accompanied drawings, the disclosure is not limited to the embodiments.

The disclosure will be described in greater detail below with reference to FIGS. 1 to 5.

Figure 1:
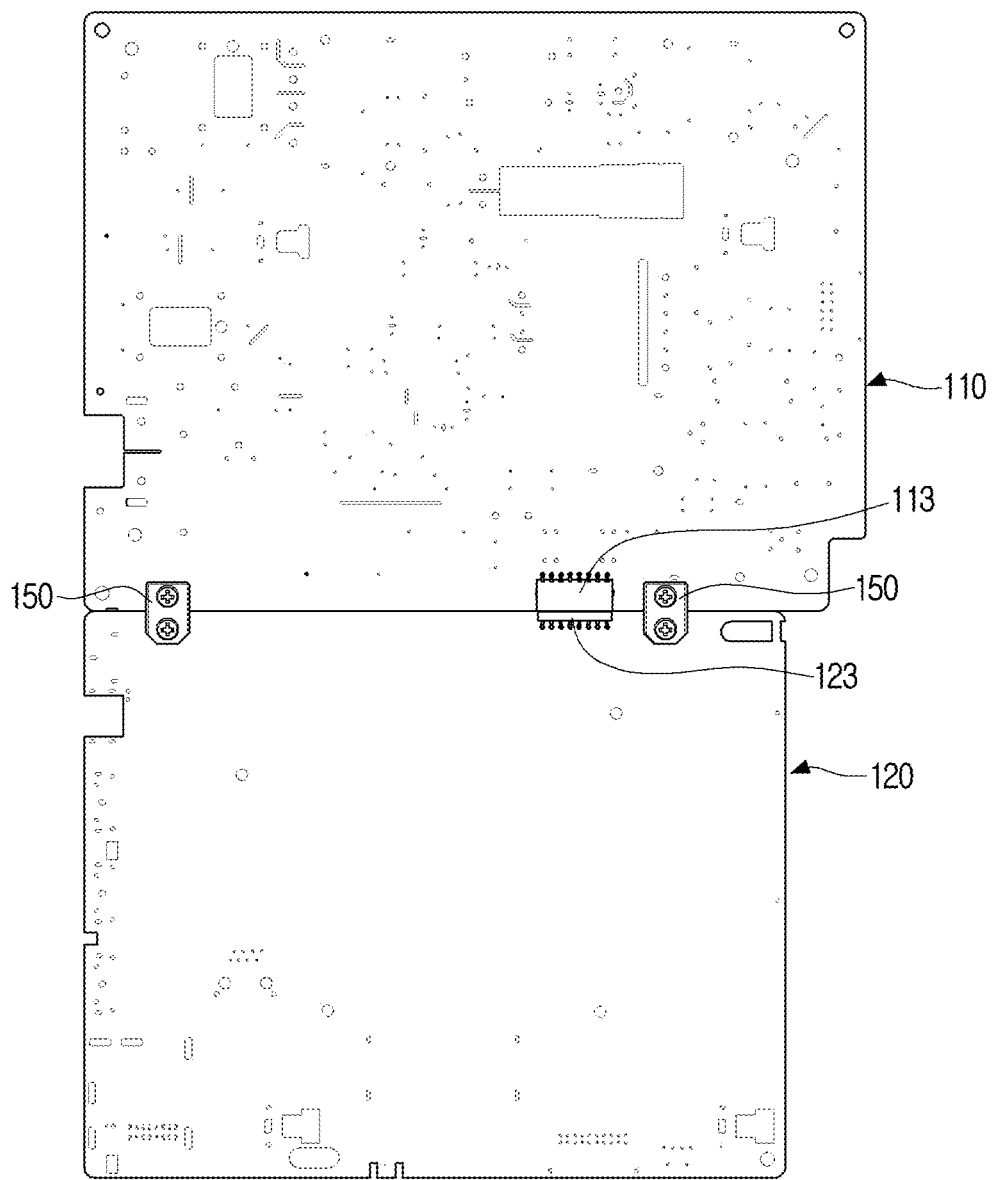
FIG. 1 is a top plan view illustrating a PCB assembly according to an embodiment of the disclosure.

FIG. 1 is a top plan view illustrating a PCB assembly 100 according to an embodiment of the disclosure.

Referring to FIG. 1, the PCB assembly 100 may include a first PCB 110 and a second PCB 120.

The printed circuit board refers to a thin plate to which electric components such as a resistance material or a switch are installed according to the related art, and may be used variously in electronic devices such as, for example, and without limitation, computers, mobile phones, and TVs. The PCB may be of a structure to which circuits of various types are installed on one substrate, or may be of a structure coupled through a bonding process such as a soldering process after PCBs of different types are manufactured.

The PCB assembly 100 of the disclosure may be an assembly in which the first PCB 110 and the second PCB 120 are coupled by the holder 150. For example, a one side surface of the first PCB 110 and a one side surface of the second PCB 120 may be in contact facing each other, and may be assembled by being coupled with each other by the holder 150 in this state.

The first PCB 110 and the second PCB 120 may be individual PCBs in which the base substrate does not form one body but is differently formed, and the first PCB 110 and the second PCB 120 may be PCBs of different types to which circuits performing different roles such as the power unit and the signal unit are installed, and may also be PCB substrates of the same type. The first PCB 110 and the second PCB 120 may be referred to as a first substrate 110 and a second substrate 120, and will be described as the first PCB 110 and the second PCB 120 below.

The PCB assembly 100 may be configured so that the first PCB 110 and the second PCB 120 are manufactured respectively to be coupled and separated. The first PCB 110 and the second PCB 120 may be electrically connected by a connector 123 and a socket 113, and may receive power or an electrical signal.

When comparing with a PCB to which a plurality of circuits are installed on one base substrate in the manufacturing process of the PCB assembly 100, the manufacturing cost of the PCB assembly 100 may be reduced. A power board and an image board of a display device when the first PCB 110 and the second PCB 120 of the PCB assembly 100 are of different types will be described as an example.

Although the power board which is the first PCB 110 may be implemented as not only a single-sided board but also a double-sided board, it may be difficult structurally for the image board which is the second PCB 120 to be implemented as a double-sided board. Accordingly, when the PCB assembly 100 is formed as a one single board substrate, the whole in terms of the design and manufacturing of the PCB assembly 100 may not be utilized double-sidedly, and manufacturing costs may increase because only a portion may be manufactured double-sidedly or the whole may be manufactured single-sidedly.

Because the PCB assembly 100 of the disclosure is configured so that the first PCB 110 and the second PCB 120 of different types are manufactured respectively and coupled, the first PCB 110 which is the power board may be manufactured as a double-sided board and the second PCB 120 which is the image board may be manufactured as a single-sided board and then coupled. Because it is possible to separate and replace when only one of the first PCB 110 and the second PCB 120 breaks or requires replacement, and an appropriate power board and image board may be combined and used according to the subject device, there is the advantage of being able to mass produce the power boards and the image boards, respectively.

Accordingly, when only the second PCB 120 of the first PCB 110 or the second PCB 120 of different types requires changing due to performance changes or technological development, only the second PCB 120 may be replaced and a pre-manufactured the first PCB 110 may be used, and when the PCB assembly 100 needs to replace one of the first PCB 110 or the second PCB 120 for maintenance, repair or change, only the corresponding PCB may be separated and replaced.

Figure 2A:
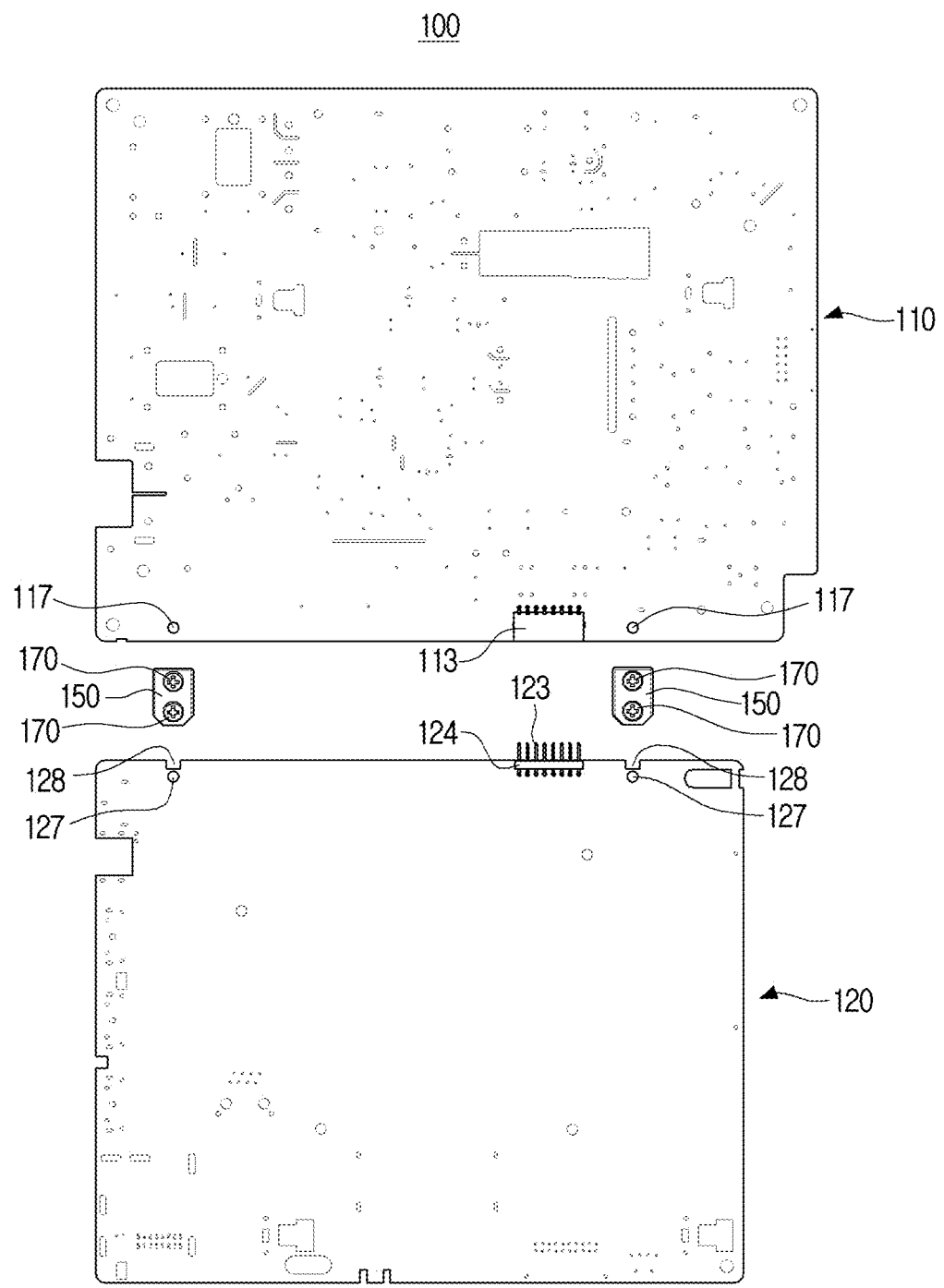
FIG. 2A is an exploded top plan view illustrating a PCB assembly according to an embodiment of the disclosure.
Figure 2B:
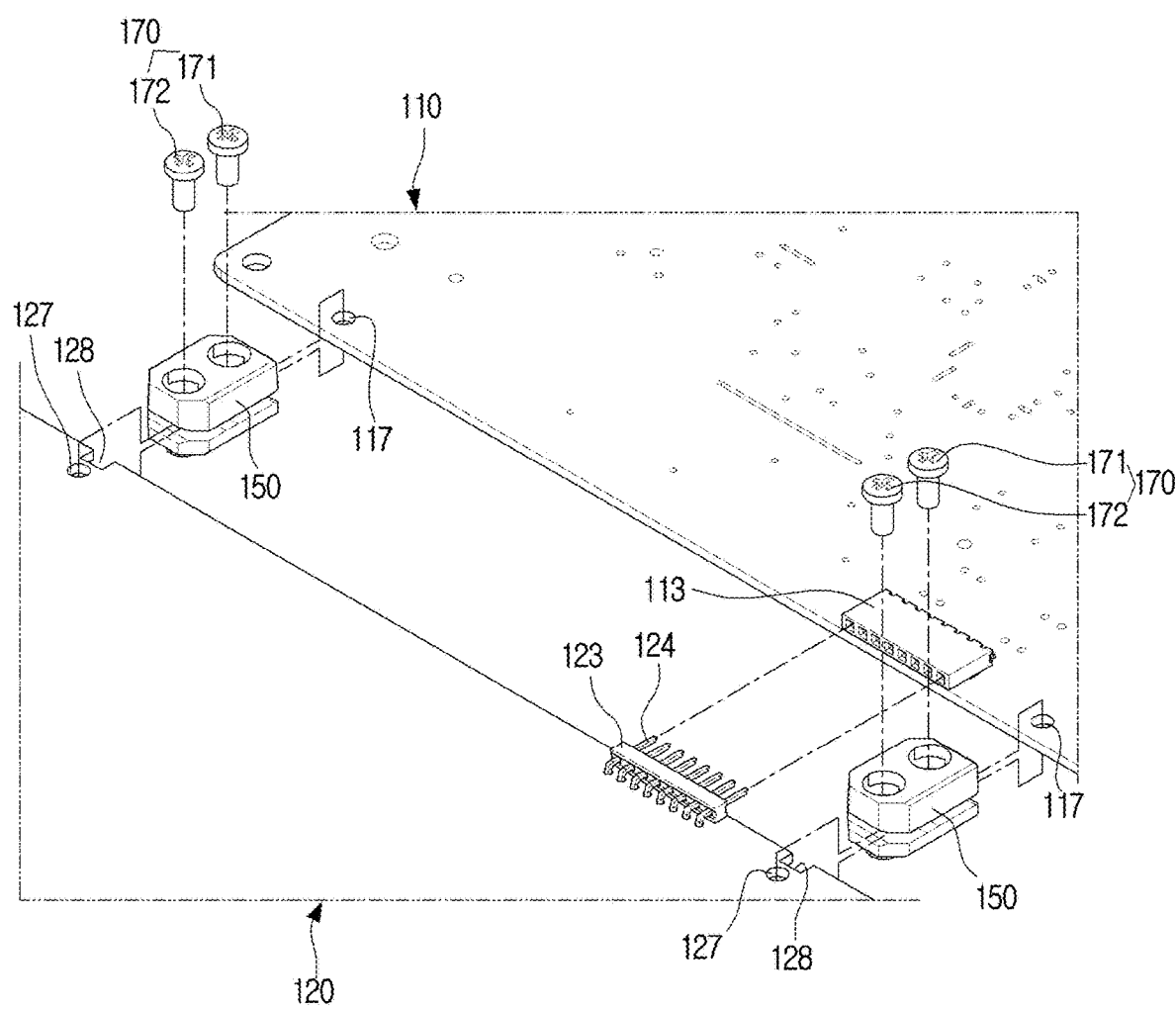
FIG. 2B is an exploded perspective view illustrating a PCB assembly according to an embodiment of the disclosure.

FIG. 2A is an exploded top plan view illustrating the PCB assembly 100 according to an embodiment of the disclosure, and FIG. 2B is an exploded perspective view illustrating the PCB assembly 100 according to an embodiment of the disclosure.

Referring to FIGS. 2A and 2B, the PCB assembly 100 may include a holder 150 and a plurality of fixing screws 170.

The holder 150 may support the first PCB 110 and the second PCB 120, and may be fixed with the first PCB 110 and the second PCB 120 by the plurality of fixing screws 170.

The first PCB 110 may include a first hole 117, and the first hole 117 may be disposed adjacent to the one side surface of the first PCB 110. The second PCB 120 may include a second hole 127 disposed so as to face the first hole 117, and the second hole 127 may be disposed adjacent to the one side surface of the second PCB 120 which faces with the one side surface of the first PCB 110.

The holder 150 may be disposed to an area in which the first hole 117 and the second hole 127 face each other, and the holder 150 may be fixed to the first hole 117 and the second hole 127 by the plurality of fixing screws 170 and may couple the first PCB 110 and the second PCB 120. The first hole 117 and the second hole 127 may have a same diameter, or may be differently designed taking into consideration the structure and weight of the first PCB 110 and the second PCB 120.

Figure 3A:
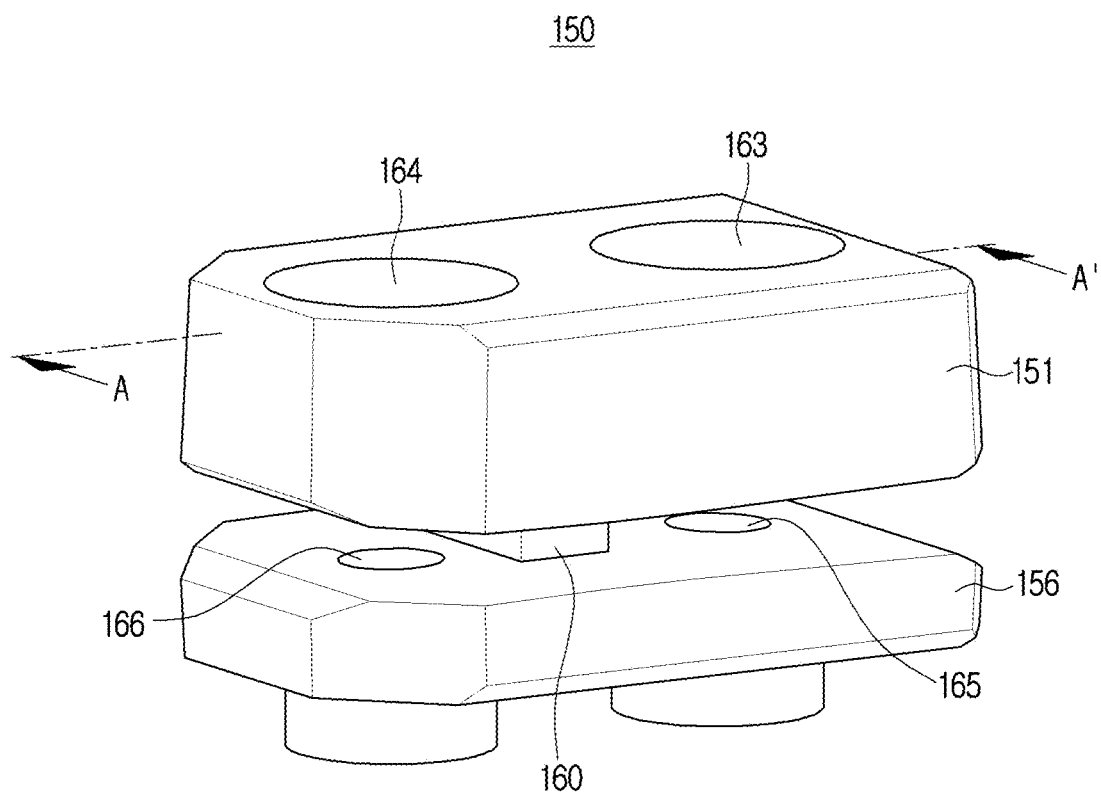
FIG. 3A is a perspective view illustrating a holder according to an embodiment of the disclosure.

The holder 150 may be formed with third to sixth holes 163, 164, 165 and 166 (referring to FIG. 3A) and each of the plurality of fixing screws 170 may penetrate through one or more of the third to sixth holes 163, 164, 165 and 166 (referring to FIG. 3A). The detailed structure of the holder 150 may be described below with reference to FIGS. 3A and 3B.

The first PCB 110 may be configured so that the first hole 117 and the socket 113 are spaced apart and disposed to the one side surface, and the second PCB 120 may be configured so that the second hole 127 and the connector 123 are disposed to face the first hole 117 and the socket 113 on a one side surface facing the one side surface of the first PCB 110. The first PCB 110 and the second PCB 120 may be coupled by the holder 150 and the socket 113 and the connector 123 may be connected. The connector 123 may include a connection part 124 which is protruded to the outside of the one side surface of the second PCB 120 to accommodate and connect the connection part 124 of the connector 123 in the socket 113, and the one side surface of the first PCB 110 and the one side surface of the second PCB 120 which face each other may be in contact with each other.

Because the PCB assembly 100 of the disclosure is in a method in which the first PCB 110 and the second PCB 120 are bonded in their respective one side surface directions, the substrate may be manufactured and implemented so that the one side surfaces include the first hole 117 and the second hole 127 respectively, and structurally, may not be limited by the size, shape, and the like of each of the first PCB 110 and the second PCB 120.

The holder 150 may have a structure and shape which accommodates the first PCB 110 and the second PCB 120 by corresponding to the thickness and type thereof, respectively. Specifically, the type of at least a portion of the layer which comprises each of the first PCB 110 and the second PCB 120 may be different, and thereby the weight or thickness of the first PCB 110 and the second PCB 120 may be different. Accordingly, the holder 150 may be varied in structure and shape of the area which accommodates each of the first PCB 110 and the second PCB 120, and may fix the plurality of PCBs which is different in thickness or type.

Specifically, based on the first PCB 110 and the second PCB 120 having different weights, the holder 150 may be configured such that the shape of the area which contacts with the first PCB 110 and the area which contacts with the second PCB 120 is different corresponding to the weight of each of the first PCB 110 and the second PCB 120. That is, the holder 150 may be configured so that the thickness, area, and the like of an upper plate 151 and a lower plate 156 of an area which accommodates the heavier PCB is formed thicker or greater than the area accommodating the lighter PCB.

Alternatively, based on the thickness of the layers comprising each of the first PCB 110 and the second PCB 120 being different, the holder 150 may be configured so that the distance between the upper plate 151 and the lower plate 156 in the area which contacts with the first PCB 110 and the area which contacts with the second PCG 120 respectively is different corresponding to the thickness of each of the first PCB 110 and the second PCB 120. Through the above, the holder 150 may be varied in shape, coupling structure, and the like of each of the upper plate 151, the lower plate 156 or a protrusion part 160, and may effectively support and fix the PCBs of different types.

In addition, a stack number of the first PCB 110 and a stack number of the second PCB 120 may be different, and the thickness of the first PCB 110 and the thickness of the second PCB 120 may be substantially the same. The stack number of the first PCB 110 may be a stack number of first insulation films and first conductive patterns which are alternately stacked. The stack number of the second PCB 120 may be a stack number of second insulation films and second conductive patterns which are alternatively stacked. If the stack number of the first PCB 110 is different from the stack number of the second PCB 120, the weight of the first PCB 110 and the weight of the second PCB 120 may be different from each other. The first PCB 110 may include the first hole 117 in plurality to be spaced apart from one another, and the second PCB 120 may include the second hole 127 in plurality to face the plurality of first holes 117. In this case, the first substrate may be configured such that the first hole 117, the socket 113, and the first hole 117 are disposed spaced apart in this order to the one side surface, and the second substrate may be configured such that the second hole 127, the connecter 123, and the second hole 127 are disposed spaced apart in this order to the one side surface.

The holder 150 and the plurality of fixing screws 170 may be provided in plurality to correspond to the plurality of first holes 117. Accordingly, through the plurality of first holes 117, the plurality of second holes 127, and the plurality of holders 150, the PCB assembly 100 of the disclosure may stably fix the first PCB 110 on which the connector 123 and the socket 113 are positioned and a bonding surface of the second PCB 120 through a plurality of fixing parts.

The holder 150 may include an upper plate 151 which is disposed on a top surface of the second PCB 120 and a lower plate 156 which is disposed under a bottom surface of the second PCB 120, and the lower plate 156 may include a protrusion part 160 (referring to FIG. 3A) which penetrates and couples through the second PCB 120.

The protrusion part 160 may be interposed between the first PCB 110 and the second PCB 120 in-between the upper plate 151 and the lower plate 156. According to an embodiment of the disclosure, the protrusion part 160 of the lower plate 156 may be coupled with the upper plate 151 by penetrating through the first PCB 110 so that the lower plate 156 and the upper plate 151 are connected. Then, the upper plate 151, the lower plate 156, and the protrusion part 160 of the holder 150 may be comprised to one body. The protrusion part 160 may be configured such that the position of the protrusion part 160 is positioned at a center area of the upper plate 151 and the lower plate 156, and the holder 150 may be referred to as a H-beam holder 150. However, the position of the protrusion part 160 is not limited thereto, and may be satisfied so long as it connects and supports the upper plate 151 with the lower plate 156.

The plurality of fixing screws 170 may include a first fixing screw 171 and a second fixing screw 172. According to an embodiment, the plurality of fixing screws 170 may be various coupling members 170 that are not be limited to screws as members performing a fixing role, and the first fixing screw 171 and the second fixing screw 172 may be referred to as the a first coupling member 171 and a second coupling member 172. Although the fixing screw 170 has been described as the coupling member 170 below, the embodiment is not limited thereto, and may be substituted to coupling members 170 of various types. The first fixing screw 171 may penetrate through all of the third hole 163 of the upper plate 151 of the holder 150, the first hole 117 of the first PCB 110, and the fifth hole 165 of the lower plate 156 of the holder 150, and the second fixing screw 172 may penetrate through all of the fourth hole 164 of the upper plate 151 of the holder 150, the second hole 127 of the second PCB 120, and the sixth hole 166 of the lower plate 156 of the holder 150.

The plurality of fixing screws 170 may be fixed as the upper part and the lower part are supported by the upper plate 151 and the lower plate 156 of the holder 150, and may fix the first PCB 110 and the second PCB 120 by passing through the first hole 117 and the second hole 127. The plurality of fixing screws 170 may be a screw with at least a portion being a cylindrical shape or a conical shape, or a male screw formed with crests and roots, that is, a bolt.

Because the holder 150 supports and fixes each of the top surface and the bottom surface of the first PCB 110 and the second PCB 120 through the upper plate 151 and the lower plate 156, bending generated by a load of the first PCB 110 or the second PCB 120 may be suppressed, and the coupling of the first PCB 120 and the second PCB 120 may be stably supported even when an external force is exerted to the PCB assembly 100.

Because the holder 150 is fixed by the plurality of fixing screws 170, the first PCB 110 and the second PCB 120 may be stably fixed without going through a welding process such as soldering to fix each configuration in the process of coupling the PCB assembly 100. In addition, even after the coupling, the first PCB 110 and the second PCB 120 may be separated and replaced if necessary.

Because the holder 150 is capable of supporting the top and bottom surfaces of the first PCB 110 and the second PCB 120 while coupling in-between the first PCB 110 and the second PCB 120, the PCB assembly 100 may be prevented from the phenomenon of bending by its own weight or being damaged by external force, or the like, and particularly, the bending phenomenon which may be generated at the coupling part of the first PCB 110 and the second PCB 120 of different weights from each other or different thickness from each other may be suppressed.

Figure 3B:
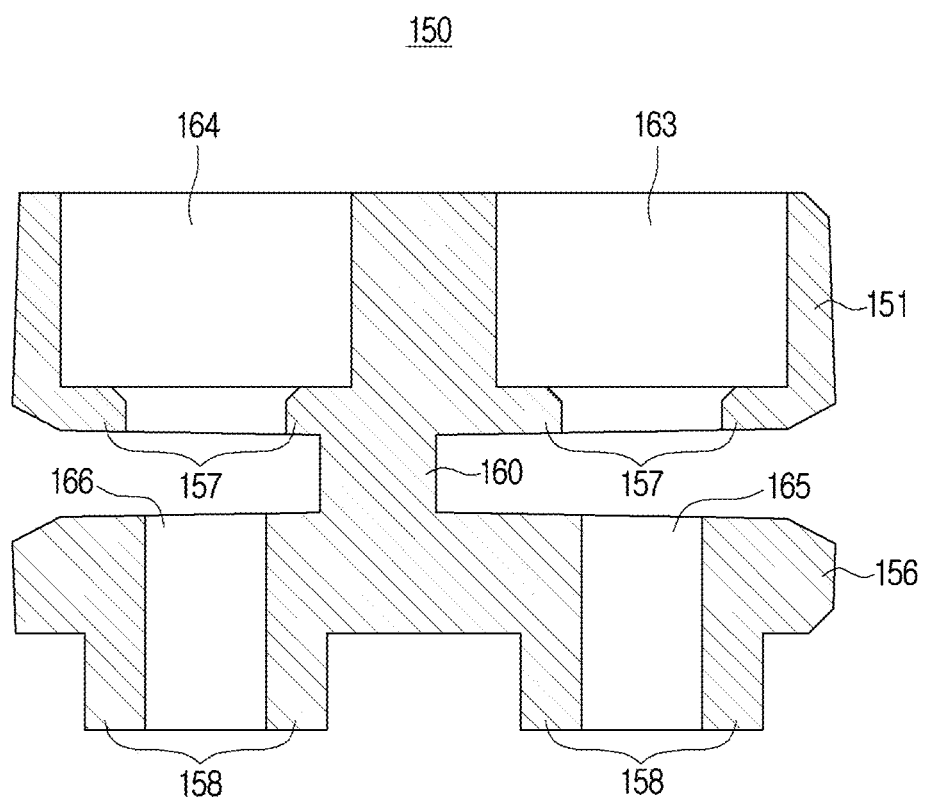
FIG. 3B is a side cross-sectional view illustrating a holder according to an embodiment of the disclosure.

FIG. 3A is a perspective view illustrating the holder 150 according to an embodiment of the disclosure, and FIG. 3B is a side cross-sectional view illustrating the holder 150 according to an embodiment of the disclosure, and more specifically, a side cross-sectional view taken along A-A' direction of the holder 150 of FIG. 3A.

Referring to FIG. 3A, the holder 150 may include an upper plate 151, a lower plate 156, and a protrusion part 160.

The upper plate 151 may be disposed on the one surface of the first PCB 110 and the one surface of the second PCB 120, specifically, at the upper part of the first hole 117 and the second hole 127, and the upper plate 151 may suppress bending in the top surface direction of the bonding surface of the first PCB 110 and the second PCB 120. The upper plate 151 may include a third hole 163 which is disposed at the upper part of the first hole 117 and a fourth hole 164 which is disposed at the upper part of the second hole 127.

Each of the third hole 163 and the fourth hole 164 may have the same diameter with the first hole 117 and the second hole 127. In this case, the plurality of fixing screws 170 coupled to the holder 150 may be configured so that a screw head is protruded over the top surface of the holder 150. In this case, because the front surfaces of the side surface parts of the third hole 163 and the fourth hole 164 surround and support the side surface part of the plurality of fixing screws 170, the upper plate 151 may be configured to stably fix the plurality of fixing screws 170.

Each of the third hole 163 and the fourth hole 164 may have a diameter bigger than the first hole 117 and the second hole 127, and may have a diameter greater than or equal to the diameter of the screw head of the plurality of fixing screws 170. In this case, the third hole 163 and the fourth hole 164 may accommodate the screw heads of the plurality of fixing screws 170, and the screw heads of the plurality of fixing screws 170 coupled to the holder 150 may be accommodated inside the upper plate 151. After the plurality of fixing screws 170 are coupled, the plurality of fixing screws 170 may be prevented from detaching through the dislodgement prevention process of covering a cover to the top surface of the upper plate 151, inserting an adhesion member, or the like.

The lower plate 156 may be disposed on the other surface facing the one surface of the first PCB 110 to which the upper plate 151 is disposed and the other surface facing the one surface of the second PCB 120, specifically, at the lower part of the first hole 117 and the second hole 127, and the lower plate 156 may suppress bending in the bottom surface direction of the bonding surface of the first PCB 110 and the second PCB 120. The lower plate 156 may include a fifth hole 165 which is disposed at the lower part of the first hole 117, and a sixth hole 166 which is disposed at the lower part of the second hole 127.

Each of the fifth hole 165 and the sixth hole 166 may have a diameter which is less than or equal to the diameters of the first hole 117 and the second hole 127, and the fifth hole 165 and the sixth hole 166 may accommodate and support the lower part of the plurality of fixing screws 170 which penetrated through the first hole 117 and the second hole 127.

The fifth hole 165 and the sixth hole 166 may have a shape corresponding to the shape of the plurality of fixing screws 170. If the plurality of fixing screws 170 has a screw shape, the fifth hole 165 and the sixth hole 166 may be of a shape in which the diameter reduces in the lower end direction, or if the plurality of fixing screws 170 has a male screw shape, the fifth hole 165 and the sixth hole 166 may have a female screw shape having a pitch corresponding to the male screw shape.

Referring to FIG. 3B, the holder 150 may include a support part 157 and an extension part 158.

The support part 157 of the upper plate 151 may be formed to protrude from side walls of the lower part of the third hole 163 and the fourth hole 164 adjacent to the first PCB 110 and the second PCB 120 to the inside of the third hole 163 and the fourth hole 164. The support part 157 may be provided to protrude in a direction perpendicular with a extending direction of the third hole 163 and the fourth hole 164, and support the screw head of each of the plurality of fixing screws 170 in the third hole 163 and the fourth hole 164 formed in the upper plate 151. The bottom surface of the screw heads of the plurality of fixing screws 170 may contact the top surface of the support part 157, and the support part 157 may fix the plurality of fixing screws 170. The shape of the support part 157 may be designed to correspond to the shape of each of the first fixing screw 171 and the second fixing screw 172.

The extension part 158 of the lower plate 156, having a structure in which the fifth hole 165 and the sixth hole 166 are extended to be protruded from the bottom surface of the lower plate 156, may be formed to be protruded in a perpendicular direction which extends toward the bottom surface of the lower plate 156, and may support the lower part of the plurality of fixing screws 170. The extension part 158 may be configured so that the fifth hole 165 and the sixth hole 166 surround and support the side surface part of the lower end of the plurality of fixing screws 170 with a wider area, and may firmly maintain the fixing of the plurality of fixing screws 170 and the holder 150.

The protrusion part 160 may be a member having a certain thickness so as to connect and support the upper plate 151 and the lower plate 156, or may be a rope of thin thickness or a thin film comprised of lines or surfaces. The protrusion part 160 may be present in plurality.

Figure 4:
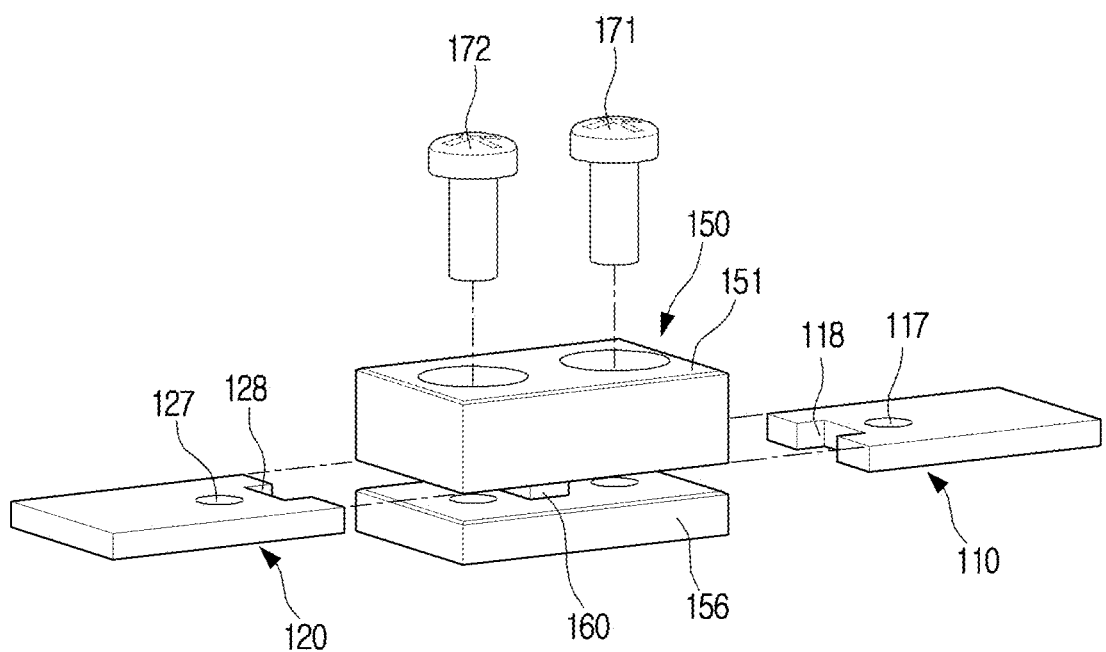
FIG. 4 is a perspective view illustrating a coupling structure of a holder according to an embodiment of the disclosure.

FIG. 4 is a perspective view illustrating a coupling structure of the holder 150 according to an embodiment of the disclosure. Descriptions that overlap with FIGS. 2A and 2B from among the description on FIG. 4 may be omitted.

Referring to FIG. 4, the holder 150 may include the protrusion part 160. The protrusion part 160 may be configured to contact one side surface of each of the first PCB 110 and the second PCB 120, and if the protrusion part 160 has a width of a predetermine value or more, a clearance may be generated between the bonded surface of the first PCB 110 and the second PCB 120 by the protrusion part 160. In this case, in order to prevent clearance, the protrusion part 160 may be accommodated in an accommodating member formed on the first PCB 110 and/or the second PCB 120. The protrusion part 160 may be provided within insertion parts 118 and 128.

The insertion parts 118 and 128 may have a groove shape which is recessed from a one side surface of the second PCB 120, and may be formed at an end part of the one side surface on which the first hole 117 and the second hole 127 are formed from each of the first PCB 110 and the second PCB 120 to accommodate the protrusion part 160. According to an embodiment of the disclosure, the insertion part 128 may accommodate the protrusion part 160 by being present only on the second PCB 120 as illustrated in FIG. 2B, and according to another embodiment of the disclosure, the insertion parts 118 and 128 may be present on each of the first PCB 110 and the second PCB 120 and each accommodate at least a portion of the protrusion part 160 as illustrated in FIG. 3C.

That is, the first PCB 110 and/or the second PCB 120 may include insertion parts 118 and 128 which are recessed from the one side surface thereof, and the insertion parts 118 and 128 may be provided adjacent to the first hole 117 and/or the second hole 127 in a direction parallel with the top surface or the bottom surface of the first PCB 110 and/or the second PCB 120. Accordingly, the protrusion part 160 may be accommodated in the insertion parts 118 and 128 and the side surface part of the protrusion part 160 may be supported by the insertion parts 118 and 128 raising the coupling stability of the holder 150, and the clearance between the first PCB 110 and the second PCB 120 may be prevented.

Figure 5A:
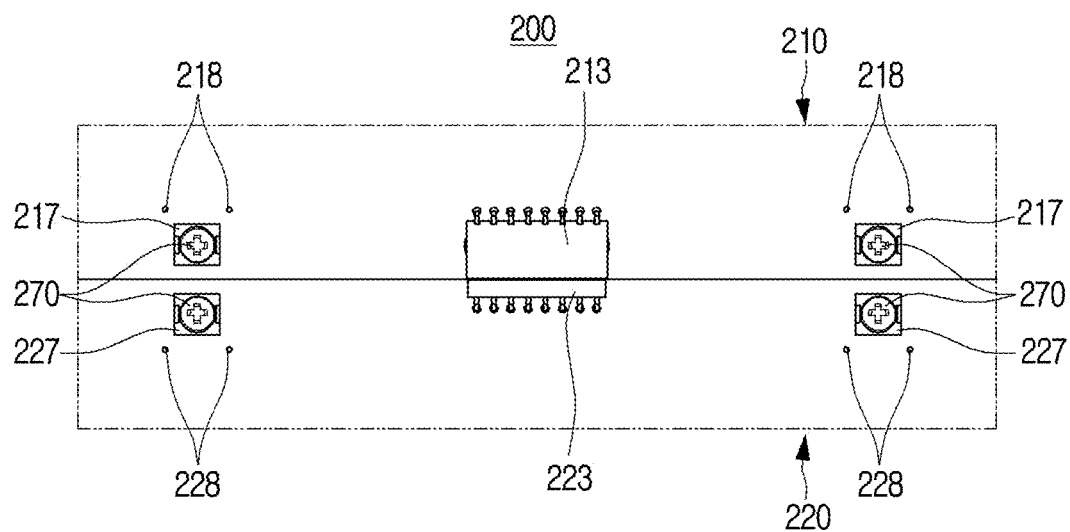
FIG. 5A is a top plan view illustrating a PCB assembly according to an embodiment of the disclosure.
Figure 5B:
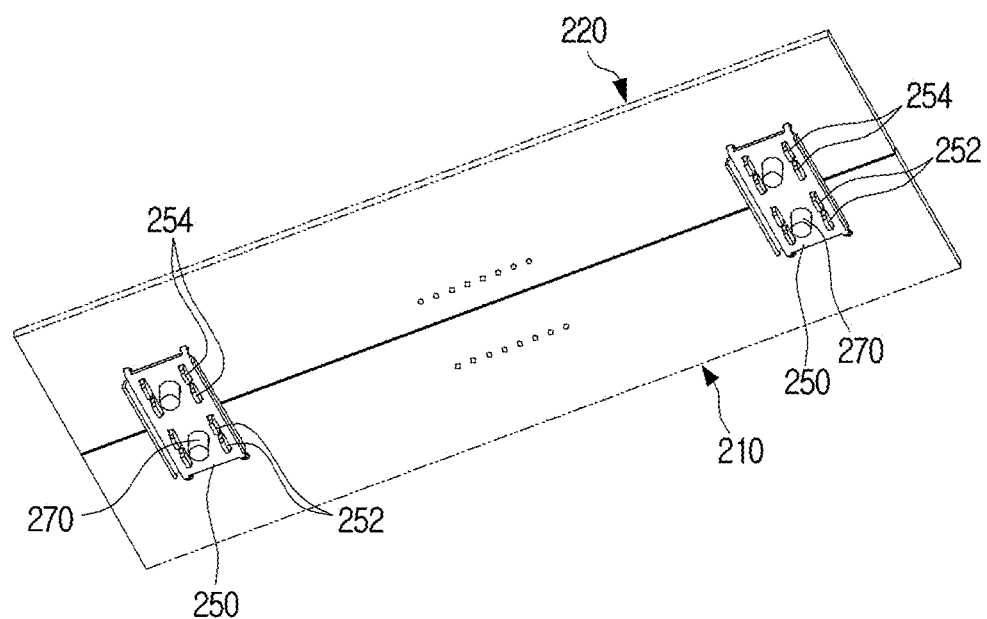
FIG. 5B is a rear perspective view illustrating a PCB assembly according to an embodiment of the disclosure.

FIG. 5A is a top plan view illustrating a PCB assembly 200 according to an embodiment of the disclosure, and FIG. 5B is a rear perspective view illustrating the PCB assembly 200 according to an embodiment of the disclosure.

Referring to FIGS. 5A and 5B, the PCB assembly 200 according to another embodiment of the disclosure may include a first upper plate 217, a second upper plate 227, and a lower plate 250. In describing FIGS. 5A and 5B below, descriptions overlapping with FIGS. 1 to 4 will be omitted, and different structures will be focused and described.

The structure of a first PCB 210 and a second PCB 220 of the PCB assembly 200 may be the same as the structure including the first hole 117 and the second hole 127 of the first PCB 110 and the second PCB 120 of the PCB assembly 100 of an embodiment of the disclosure, and the PCB assembly 200 may have a different coupling method of the first PCB 210 and the second PCB 220 from that of the PCB assembly 100.

The upper plates 217 and 227 may be disposed at the upper part of a first hole 219 and a second hole 229, and may include a third hole 263 disposed at the upper part of the first hole 219 and a fourth hole 264 disposed at the upper part of the second hole 229. In this case, the upper plates 217 and 227 may include a first upper plate 217 which is disposed at the upper part of the first hole 219 and includes the third hole 263 disposed at the upper part of the first hole 219, and a second upper plate 227 which is disposed at the upper part of the second hole 229 and includes the fourth hole 264 disposed at the upper part of the second hole 229.

That is, each of the first upper plate 217 and the second upper plate 227 may be disposed at the upper part of each of the first PCB 210 and the second PCB 220, a plurality of fixing screws 270 may be configured to penetrate through the third hole 263 or the fourth hole 264 formed at a center part, and support the screw heads of the plurality of fixing screws 270.

The lower plate 250 may be disposed at the lower part of the first PCB 210 and the second PCB 220, and the plurality of fixing screws 270 may penetrate through the fifth to sixth holes 253 and 256 formed at the center part to correspond to the upper plates 217 and 227. The lower plate 250 may support the first PCB 210 and the second PCB 220, and may suppress bending which may generate at the bonding surface. Because the lower plate 250 has a structure in which the fifth to sixth holes 253 and 256 are extended to be protruded and extended from the top surface of the lower plate 250, the fixing force of the plurality of fixing screws 270 may be increased.

Each of the first PCB 210 and the second PCB 220 may include a plurality of auxiliary protrusions 252 and 254 which is formed at the position of the upper plates 217 and 227, that is at the rear surface adjacent to the first hole 117 and the second hole 127, and the lower plate 250 may include a plurality of auxiliary protrusion holes 259 through which the plurality of auxiliary protrusions 252 and 254 pass and is fixed thereto. The plurality of auxiliary protrusions 252 and 254 may be fixed to the plurality of auxiliary protrusion holes 259, and may stably fix the first PCB 210 and the second PCB 220 to the lower plate 250 together with the plurality of fixing screws 270.

Figure 6:
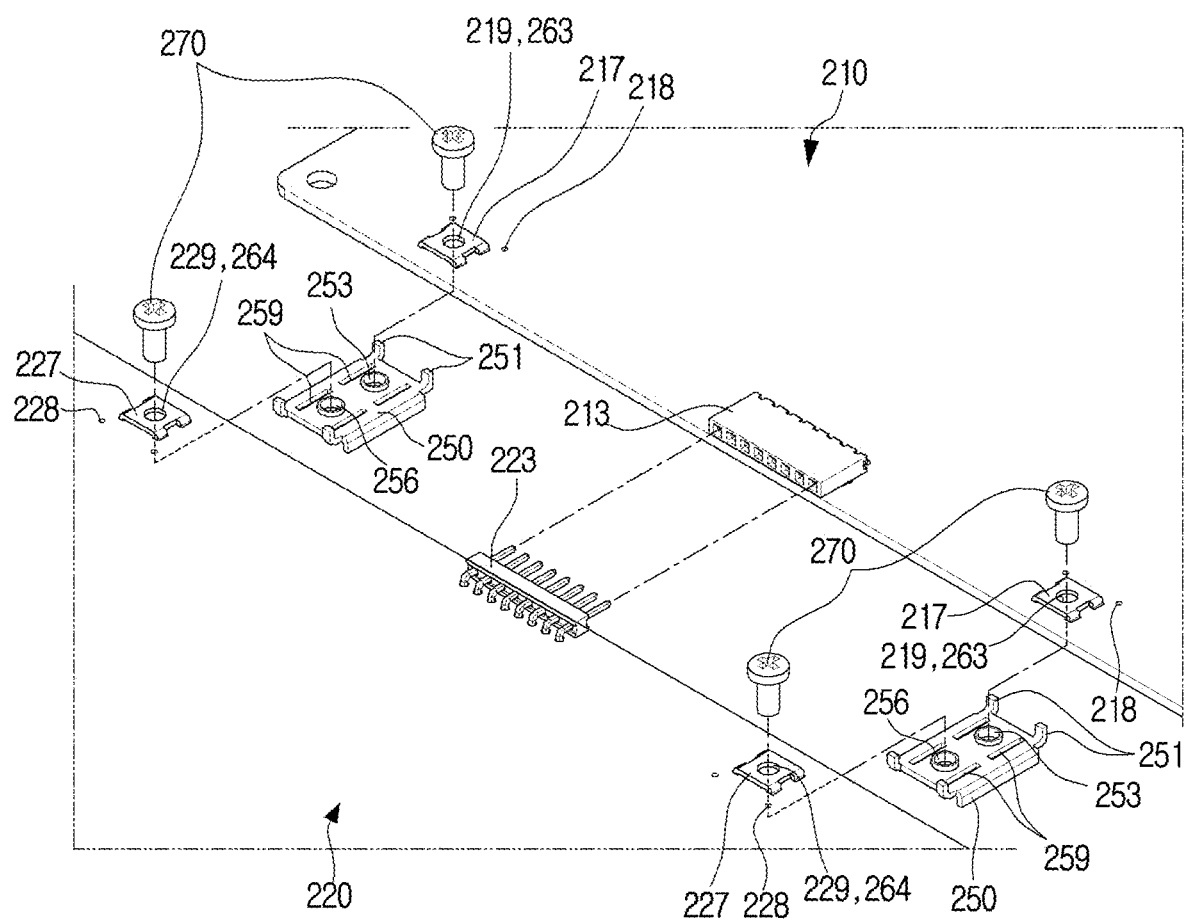
FIG. 6 is an exploded perspective view illustrating a PCB assembly according to an embodiment of the disclosure.

FIG. 6 is an exploded perspective view illustrating the PCB assembly 200 according to an embodiment of the disclosure.

Referring to FIG. 6, the first PCB 210 and the second PCB 220 may include insertion parts 218 and 228, and the lower plate 250 may include a protrusion part 251.

The lower plate 250 may include the protrusion part 251 which penetrates through the first PCB 210 and couples. The protrusion part 251 may penetrate through the insertion part 218 of the first PCB 210, and stably fix the lower plate 250 and the first PCB 210. The protrusion part 251 may be provided as a plurality of protrusion parts 251 which extends from both end parts in the horizontal direction of the lower plate 250 to the upper part and may be provided so as to correspond to the inside of the insertion parts 218 and 228, and the protrusion part 251 and the insertion part 218 may be present in plurality at positions facing each other.

Each of the first PCB 210 and the second PCB 220 may include a plurality of insertion parts 218 and 228 which are formed at the position of the upper plates 217 and 227, that is adjacent to the first hole 117 and the second hole 127, and the lower plate 250 may include a plurality of auxiliary columns 251 which is inserted into and fixed to the plurality of insertion parts 218 and 228. The plurality of protrusion parts 251 may be formed at a distal end of the lower plate 250 toward the upper part and extended to the upper part, and may have a diameter corresponding to the diameter of the plurality of insertion parts 218 and 228. The plurality of protrusion parts 251 may be fixed to the plurality of insertion parts 218 and 228, and may stably fix the first PCB 210 and the second PCB 220 to the lower plate 250 together with the plurality of fixing screws 270.

The insertion parts 218 and 228 may be adjacent to the first hole 219 and the second hole 229 and formed in plurality to both side surfaces, and the insertion parts 218 and 228 may have a hole shape penetrating each of the first PCB 110 and the second PCB 120. The protrusion part 251 may be formed at a position facing the insertion parts 218 and 228. In addition, because the protrusion part 251 is configured to have a structure which extends from both end parts in the horizontal direction of the lower plate to the upper part, a supporting and fixing effect of the lower plate 250 may be increased.

Likewise, the plurality of auxiliary protrusions 219 and 229 may also be formed in plurality at both side surfaces of the first hole 219 and the second hole 229 in each of the first PCB 210 and the second PCB 220, and the auxiliary protrusion hole 259 of the lower plate 250 may be formed in plurality at positions facing the plurality of auxiliary protrusions 252 and 254.

The plurality of protrusion parts 251 may be fixed as it passes the plurality of insertion parts 218 and 228 from the lower plate 250 toward the direction of the first PCB 210 and the second PCB 220, and the plurality of auxiliary protrusions 252 and 254 may be fixed to the plurality of auxiliary protrusion holes 259 from the first PCB 210 and the second PCB 220 toward the direction of the lower plate 250. Accordingly, the lower plate 250 may be fixed with the first PCB 210 and the second PCB 220 in the upper and lower directions and may stably support the coupling of the first PCB 210 and the second PCB 220 even when bending is generated in the first PCB 210 and the second PCB 220 or when force is applied from the outside.

In the above, although each of various embodiments have been described individually, each embodiment may not necessarily be implemented as a sole embodiment, and the configurations and operations of each embodiment may be implemented in combination with at least one other embodiment.

While the disclosure has been illustrated and described with reference to various example embodiments thereof, it will be understood that the various example embodiments are intended to be illustrative, not limiting. It will be understood by those skilled in the art that various changes in form and details may be made therein without departing from the true spirit and full scope of the disclosure, including the appended claims and their equivalents.

What is claimed is:

1. A printed circuit board (PCB) assembly, comprising:
a first PCB configured to have a first hole;
a second PCB configured to be disposed adjacently to the first PCB and have a second hole disposed to face the first hole;
a holder comprising an upper plate configured to be disposed at an upper of the first hole and the second hole and have a third hole disposed at the upper of the first hole and a fourth hole disposed at the upper of the second hole, and a lower plate configured to be disposed at a lower of the first hole and the second hole and have a fifth hole disposed at the lower of the first hole and a sixth hole disposed at the lower of the second hole;
a first fixing screw configured to penetrate through the third hole, the first hole and the fifth hole; and
a second fixing screw configured to penetrate through the fourth hole, the second hole and the sixth hole,
wherein the lower plate comprises a protrusion part configured to penetrate through the second PCB to couple the first PCB and the second PCB; and
wherein a one side surface of the first PCB and a one side surface of the second PCB facing each other are configured to contact each other.

2. The PCB assembly of claim 1, wherein the protrusion part is configured to couple with the upper plate for the lower plate and the upper plate to connect.

3. The PCB assembly of claim 2, wherein the second PCB comprises an insertion part configured to accommodate the protrusion part by being formed at an end part of the one side surface to which the second hole is formed,
the insertion part is configured to have a groove shape recessed from the one side surface of the second PCB, and
the protrusion part is provided in the insertion part.

4. The PCB assembly of claim 2, wherein the upper plate comprises support parts configured to be protruded from side surface of the lowers of the third hole and the fourth hole adjacent to the first PCB and the second PCB to insides of the third and fourth holes, and
the support parts are configured to support screw heads of the first fixing screw and the second fixing screw.

5. The PCB assembly of claim 2, wherein the lower plate further comprises an extension part configured to extend the fifth hole and the sixth hole to be protruded from a bottom surface of the lower plate.

6. The PCB assembly of claim 2, wherein an upper plate, a lower plate and a protrusion part of the holder is comprised as one body.

7. The PCB assembly of claim 1, wherein the first hole is disposed adjacent to a one side surface of the first PCB, and the second hole is disposed adjacent to a one side surface of the second PCB facing with the one side surface of the first PCB.

8. The PCB assembly of claim 1, wherein the first PCB comprises a socket disposed at a one side surface to which the first hole is formed, and
the second PCB comprises a connector disposed at a one side surface to which the second hole is formed and connects with the socket.

9. The PCB assembly of claim 8, wherein the connector comprises a connection part which is protruded outside of the one side surface of the second PCB, and
the socket is connected by accommodating the connection part of the connector.

10. The PCB assembly of claim 1, wherein the first PCB comprises in plurality the first hole so as to be spaced apart from one another,
the second PCB comprises in plurality the second hole so as to face the plurality of first holes, and
the holder and the plurality of fixing screws are provided in plurality to correspond to the plurality of first holes.

11. The PCB assembly of claim 1, wherein the first PCB and the second PCB are configured to have weights different from each other, and
the holder is configured so that shapes of an area accommodating the first PCB and an area accommodating the second PCB are different to correspond to the weight of each of the first PCB and the second PCB.

12. The PCB assembly of claim 1, wherein the first PCB and the second PCB are configured so that thicknesses of a layer comprising each of the first PCB and the second PCB are different from each other, and
the holder is configured so that a distance between the upper plate and the lower plate is different in each of an area accommodating the first PCB and an area accommodating the second PCB to correspond to the thicknesses of each of the first PCB and the second PCB.

13. The PCB assembly of claim 1, wherein the upper plate comprises a first upper plate configured to be disposed at the upper of the first hole and have the third hole disposed at the upper of the first hole, and a second upper plate configured to be disposed at the upper of the second hole and have the fourth hole disposed at the upper of the second hole, and
the first upper plate and the second upper plate are configured so as to be physically separated from each other.

14. The PCB assembly of claim 13, wherein the each of the first PCB and the second PCB comprise an insertion part formed adjacent to the first hole and the second hole,
the insertion part is configured to have a hole shape penetrating through each of the first PCB and the second PCB,
the protrusion part is provided as a plurality of protrusion parts configured to extend from both end parts in a horizontal direction of the lower plate to the upper, and
each of the plurality of protrusion parts is provided so as to correspond to the inside of the insertion parts.

15. The PCB assembly of claim 13, wherein the each of the first PCB and the second PCB comprise an auxiliary protrusion formed at a rear surface of each of the first PCB and the second PCB, and
the lower plate comprises an auxiliary protrusion hole through which the auxiliary protrusion passes and is fixed.

16. The PCB assembly of claim 15, wherein the auxiliary protrusion is formed in plurality at both sides of the first hole and the second hole, and
the auxiliary protrusion hole of the lower plate is formed in plurality at a position facing the plurality of auxiliary protrusions.

17. The PCB assembly of claim 13, wherein the lower plate is configured to have a structure in which the fifth hole and the sixth hole are extended to be protruded from a top surface of the lower plate.

18. A printed circuit board (PCB) assembly, comprising:
a first substrate configured to have a first hole;
a second substrate configured to be disposed at one side of the first substrate, and have a second hole;
a holder comprising an upper plate configured to be disposed on one surface of the first substrate and a one surface of the second substrate, and have a third hole and a fourth hole, a lower plate configured to be disposed on other surface facing the one surface of the first substrate and a other surface facing the one surface of the second substrate, and have a fifth hole and a sixth hole, and a protrusion part configured to be interposed between the first substrate and the second substrate in-between the upper plate and the lower plate;
a first coupling member provided inside the first hole, the third hole, and the fifth hole; and
a second coupling member provided inside the second hole, the fourth hole, and the sixth hole; and
wherein a one side surface of the first substrate and a one side surface of the second substrate facing each other are configured to contact each other.

19. The PCB assembly of claim 18, wherein the first substrate is configured to have a groove recessed from a one side surface of the first substrate, and
the protrusion part is provided inside the groove.

* * * * *